United States Patent
Liao (10) Patent No.: US 10,658,431 B2
(45) Date of Patent: May 19, 2020

(54) ORGANIC LIGHT-EMITTING DIODE HAVING CHARGE GENERATION LAYER AND MANUFACTURING METHOD THEREOF AND DISPLAY DEVICE

(71) Applicant: BOE Technology Group Co., Ltd., Beijing (CN)

(72) Inventor: Chin Lung Liao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/566,355

(22) PCT Filed: Feb. 22, 2017

(86) PCT No.: PCT/CN2017/074417
§ 371 (c)(1),
(2) Date: Oct. 13, 2017

(87) PCT Pub. No.: WO2018/028169
PCT Pub. Date: Feb. 15, 2018

(65) Prior Publication Data
US 2018/0301511 A1     Oct. 18, 2018

(30) Foreign Application Priority Data

Aug. 12, 2016   (CN) .......................... 2016 1 0665931

(51) Int. Cl.
*H01L 27/32*     (2006.01)
*H01L 51/50*     (2006.01)
(Continued)

(52) U.S. Cl.
CPC .......... *H01L 27/32* (2013.01); *H01L 51/0035* (2013.01); *H01L 51/0036* (2013.01);
(Continued)

(58) Field of Classification Search
CPC .............. H01L 51/5076; H01L 51/506; H01L 51/5096; H01L 51/50
See application file for complete search history.

(56) References Cited

U.S. PATENT DOCUMENTS

2006/0040132 A1*   2/2006   Liao ................... H01L 51/5036
                                                          428/690
2006/0108580 A1*   5/2006   Yoshida .............. H01L 51/5271
                                                          257/40
(Continued)

FOREIGN PATENT DOCUMENTS

CN          102810644 A        12/2012
CN          104253240 A        12/2014
(Continued)

OTHER PUBLICATIONS

Mar. 8, 2018—(CN) Fourth Office Action Appn 201610665931.2 with English Iran.
(Continued)

*Primary Examiner* — Nduka E Ojeh
(74) *Attorney, Agent, or Firm* — Banner & Witcoff, Ltd.

(57) ABSTRACT

An organic light-emitting diode, a manufacturing method thereof and a display device are provided. The organic light-emitting diode includes: a base substrate, a first electrode and a second electrode disposed on the base substrate, a first light-emitting layer disposed between the first electrode and the second electrode, and a charge generation layer disposed between the first light-emitting layer and the second electrode, and the charge generation layer includes a first connection layer, a carrier injection layer and a second connection layer which are stacked in sequence; the first connection layer includes an electron transport material doped with a hole blocking material, and the second con-
(Continued)

nection layer includes a hole transport material doped with an electron blocking material.

18 Claims, 2 Drawing Sheets

(51) Int. Cl.
H01L 51/56 (2006.01)
H01L 51/00 (2006.01)
H01L 51/52 (2006.01)
H01L 29/08 (2006.01)
H01L 35/24 (2006.01)

(52) U.S. Cl.
CPC ........ *H01L 51/0037* (2013.01); *H01L 51/504* (2013.01); *H01L 51/506* (2013.01); *H01L 51/5044* (2013.01); *H01L 51/5076* (2013.01); *H01L 51/5088* (2013.01); *H01L 51/5092* (2013.01); *H01L 51/5096* (2013.01); *H01L 51/56* (2013.01); *H01L 51/007* (2013.01); *H01L 51/0059* (2013.01); *H01L 51/0072* (2013.01); *H01L 51/5296* (2013.01)

(56) References Cited

U.S. PATENT DOCUMENTS

| | | | |
|---|---|---|---|
| 2008/0308149 A1* | 12/2008 | Nomura | C07D 209/12 136/256 |
| 2009/0072720 A1* | 3/2009 | Lee | H01L 51/5044 313/504 |
| 2014/0356740 A1 | 12/2014 | Yun et al. | |
| 2015/0001499 A1* | 1/2015 | Kim | H01L 51/504 257/40 |
| 2015/0001506 A1* | 1/2015 | Kim | H01L 27/3209 257/40 |
| 2015/0108456 A1* | 4/2015 | Shin | H01L 51/5044 257/40 |
| 2015/0243841 A1* | 8/2015 | Shatalov | H01L 33/0025 257/13 |
| 2015/0357577 A1 | 12/2015 | Kim et al. | |
| 2015/0357592 A1 | 12/2015 | Li et al. | |
| 2016/0247861 A1* | 8/2016 | Kim | H01L 27/3246 |
| 2016/0272753 A1* | 9/2016 | Nanson | C08K 3/04 |
| 2016/0380212 A1* | 12/2016 | Kawakami | H01L 51/0073 257/40 |
| 2016/0380219 A1* | 12/2016 | Afzali-Ardakani | H01L 51/4213 136/263 |
| 2017/0200770 A1 | 7/2017 | Bi | |
| 2018/0208836 A1* | 7/2018 | Kuma | C09K 11/06 |

FOREIGN PATENT DOCUMENTS

| | | |
|---|---|---|
| CN | 104576950 A | 4/2015 |
| CN | 104681728 A | 6/2015 |
| CN | 105161627 A | 12/2015 |
| CN | 106058066 A | 10/2016 |
| EP | 2769977 A1 | 8/2014 |
| KR | 1412511 * | 6/2013 |
| KR | 1020130079268 A | 7/2013 |
| WO | 2014076917 A1 | 5/2014 |

OTHER PUBLICATIONS

May 10, 2017—(WO) International Search Report and Written Opinion Appn PCT/CN2017/074417 with English Tran.
Jun. 1, 2017—(CN) First Office Action Appn 201610665931.2 with English Tran.
Sep. 27, 2017—(CN) Second Office Action Appn 201610665931.2 with English Tran.
Dec. 8, 2017—(CN) Third Office Action Appn 201610665931.2 with English Tran.
Liu, Enhanced Performance of Organic Light-Emitting Diodes (OLEDs) and OLED-based Photoluminescent Sensing Platforms by Novel Microstructures and Device Architectures, Iowa State University, 2012.
Jan. 30, 2020—(EP)—European Extended Search Report Appn 17778161.4.
Yu-Hao Lee, et al., "The Metal Interlayer in the Charge Generation Layer of Tandem Organic Light-Emitting Diodes" Journal of Applied Physics, 114, 154512 (2013), 7 pps.
Shing-Wu Wang, et al., "Influence of the 6 Hole-Blocking Materials on the Luminous Properties of Highly Efficient Blue Drganic Light-Emitting Diodes" <https://www.spiedigitallibrary.org/conference-proceedings-of-spie on Nov. 29, 2019>, 10 pps.

* cited by examiner

ORGANIC LIGHT-EMITTING DIODE HAVING CHARGE GENERATION LAYER AND MANUFACTURING METHOD THEREOF AND DISPLAY DEVICE

The application is a U.S. National Phase Entry of International Application No. PCT/CN2017/074417 filed on Feb. 22, 2017, designating the United States of America and claiming priority to Chinese Patent Application No. 201610665931.2, filed on Aug. 12, 2016. The present application claims priority to and the benefit of the above-identified applications and the above-identified applications are incorporated by reference herein in their entirety.

TECHNICAL FIELD

Embodiments of the present disclosure relate to an organic light-emitting diode, a manufacturing method thereof and a display device.

BACKGROUND

Organic light-emitting diodes (OLEDs) are display devices which emit light by electrically excited fluorescent organic compound or by electrically excited phosphorescence organic compound. The organic light-emitting diodes have advantages of active luminescence, all-solid-state, wide visual angle, short response, etc, so it has an extensive application prospect in a field of display.

A conventional organic light-emitting diode comprises an anode, a cathode and a light emitting layer (EML) disposed between the anode and the cathode. In a case that the conventional organic light-emitting diode is driven by external voltage, holes injected from the anode and electrons injected from the cathode enter a recombination region of the EML to form excitons by recombination, and the excitons are subjected to radiative transition to emit photons, so as to achieve electroluminescence. However, because the mobility of the holes and the mobility of the electrons are different, the injection of the holes and the electrons is unbalanced, so that the actual luminous efficiency of the conventional organic light-emitting diode is low.

SUMMARY

At least one embodiment of the present disclosure provides an organic light-emitting diode, and the organic light-emitting diode comprises: a base substrate; a first electrode and a second electrode disposed on the base substrate; a first light-emitting layer disposed between the first electrode and the second electrode; and a charge generation layer disposed between the first light-emitting layer and the second electrode, the charge generation layer comprises a first connection layer, a carrier injection layer, and a second connection layer which are stacked in sequence; the first connection layer comprises an electron transport material doped with a hole blocking material, and the second connection layer comprises a hole transport material doped with an electron blocking material.

For example, in the organic light-emitting diode provided in at least one embodiment of the present disclosure, the hole transport material comprises any one or any combination of aromatic diamine compounds, triphenylamine compounds, aromatic triamine compounds, biphenyl diamine derivatives, triarylamine polymers, and carbazole polymers.

For example, in the organic light-emitting diode provided in at least one embodiment of the present disclosure, the electron transport material comprises any one or any combination of 4,7-diphenyl-1,10-ophenanthroline, 2,9-bis(naphthalen-2-yl)-4,7-diphenyl-1,10-phenanthroline, 2,9-dimethyl-4,7-biphenyl-1,10-ophenanthroline, and 8-hydroxyquinoline aluminum.

For example, in the organic light-emitting diode provided in at least one embodiment of the present disclosure, an electrical conductivity of the electron transport material is less than $10^{-6}$ S/cm; and an electrical conductivity of the hole transport material is greater than $10^3$ S/cm.

For example, in the organic light-emitting diode provided in at least one embodiment of the present disclosure, the electron blocking material comprises any one or any combination of $MoO_3$, $Cs_2CO_3$, CsF, Al, and $Ir(ppz_3)$.

For example, in the organic light-emitting diode provided in at least one embodiment of the present disclosure, the hole blocking material comprises any one or any combination of 2-(4-biphenyl)-5-phenyl-1,3,4-oxadiazole, 3-(biphenyl-4-yl)-5-(4-tert-butylphenyl)-4-phenyl-4H-1,2,4-triazole, 1,3,5-tris(1-phenyl-1H-benzimidazol-2-yl) benzene, triphenyl quinoline, and 2,6-bis (biphenyl)-4,8-diphenyl anthracene azoline.

For example, in the organic light-emitting diode provided in at least one embodiment of the present disclosure, the carrier injection layer comprises a metal, a composite material of an organic material and a metal, or a metal compound.

For example, in the organic light-emitting diode provided in at least one embodiment of the present disclosure, a thickness of the carrier injection layer is from 0.5 nm to 2 nm.

For example, in the organic light-emitting diode provided in at least one embodiment of the present disclosure, the organic light-emitting diode further comprises a second light-emitting layer disposed between the second electrode and the charge generation layer.

For example, in the organic light-emitting diode provided in at least one embodiment of the present disclosure, the first light-emitting layer comprises a first light-emitting unit and a second light-emitting unit, and the second light-emitting layer comprises a third light-emitting unit, the first light-emitting unit comprises a red light emitting material, the second light-emitting unit comprises a green light emitting material, and the third light-emitting unit comprises a blue light emitting material.

For example, the organic light-emitting diode provided in at least one embodiment of the present disclosure, further comprises an electron transport layer disposed between the second electrode and the second light-emitting layer, and a hole transport layer disposed between the first electrode and the first light-emitting layer.

For example, in the organic light-emitting diode provided in at least one embodiment of the present disclosure, a thickness of the hole transport layer is from 10 nm to 180 nm; and a thickness of the electron transport layer is from 10 nm to 35 nm.

For example, in the organic light-emitting diode provided in at least one embodiment of the present disclosure, a hole injection layer disposed between the first electrode and the hole transport layer, and an electron injection layer disposed between the second electrode and the electron transport layer.

For example, in the organic light-emitting diode provided in at least one embodiment of the present disclosure, a thickness of the hole injection layer is from 10 nm to 180 nm; and a thickness of the electron injection layer is from 1 nm to 5 nm.

For example, in the organic light-emitting diode provided in at least one embodiment of the present disclosure, a material of the hole injection layer comprises any one or any combination of poly(3,4-ethylenedioxythiophene)-polystyrolsulfon acid (PEDOT/PSS), polythiophene, and polyaniline.

For example, in the organic light-emitting diode provided in at least one embodiment of the present disclosure, a material of the electron injection layer comprises any one or any combination of LiF and 8-hydroxyquinoline-lithium.

At least one embodiment of the present disclosure further provides a display device, and the display device comprises the organic light-emitting diode described above.

At least one embodiment of the present disclosure further provides a method for manufacturing an organic light-emitting diode, and the method comprises: providing a base substrate; and forming a first electrode, a first light-emitting layer, a charge generation layer and a second electrode on the base substrate; in which the charge generation layer comprises a first connection layer, a carrier injection layer, and a second connection layer which are stacked in sequence, the first connection layer comprises an electron transport material doped with a hole blocking material, and the second connection layer comprises a hole transport material doped with an electron blocking material.

For example, in the method provided in at least one embodiment of the present disclosure, the carrier injection layer comprises a metal, a composite material of an organic material and a metal, or a metal compound.

For example, the method provided in at least one embodiment of the present disclosure further comprising: forming the first light-emitting layer on the first electrode by a solution process.

BRIEF DESCRIPTION OF THE DRAWINGS

In order to clearly illustrate the technical solution of the embodiments of the disclosure or the prior art, the drawings of the embodiments or description in the prior art will be briefly described in the following. It is obvious that the described drawings are only related to some embodiments of the disclosure, and those skilled in the art can also obtain other drawings without any inventive work according to the drawings.

DETAILED DESCRIPTION

The technical solutions in the embodiments of the disclosure will be described in a clearly and fully understandable way in connection with the drawings related to the embodiments of the disclosure. It is obvious that the described embodiments are just a part but not all of the embodiments of the disclosure. Based on the embodiments in the disclosure, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "comprises," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Figure 1:
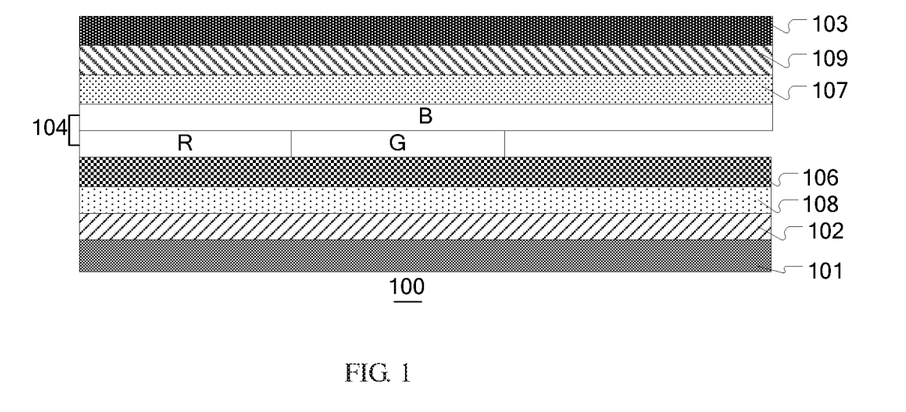
FIG. 1 is a schematic structure diagram of an organic light emitting diode.

FIG. 1 is a schematic structure diagram of an organic light emitting diode. The organic light emitting diode comprises: a base substrate 101, and a first electrode 102, an organic light-emitting layer 104 and a second electrode 103 which are disposed on the base substrate 101 in sequence. The organic light-emitting layer 104 comprises organic light emitting materials of three colors of red, green and blue. The luminous principle of the organic light emitting diode is that: in a case that the first electrode 102 and the second electrode 103 are applied a voltage to form a current, electrons and holes are recombined in the organic light emitting layer 104 to form excitons, and the organic materials in the organic light emitting layer 104 are excited to emit light. The interface characteristic between different layers of the organic light emitting diode (OLED) is particularly important to the performances of the OLED. Currently, the OLED is formed by two manufacturing processes of a solution process and a vacuum deposition process, and two adjacent layers made of different materials may be obtained by different manufacturing processes respectively. Due to the conversion of the two manufacturing processes, the interface property between different materials is inevitably affected, and particularly the organic light-emitting layer tends to be affected. For instance, phosphorescent light emitting layers are made of the red organic light emitting material and the green organic light emitting material respectively by the solution process; a fluorescent light-emitting layer comprises the blue organic light emitting material by the vapor deposition process. In the recombination region, it is difficult to control carriers, which leads to the unbalance of the electrons and the holes, so that it is difficult to obtain an ideal luminous efficacy and an ideal photochromic.

At least one embodiment of the present disclosure provides an organic light-emitting diode, a manufacturing method thereof and a display device comprising the organic light-emitting diode. The organic light-emitting diode comprises: a base substrate; a first electrode and a second electrode disposed on the base substrate; a first light-emitting layer disposed between the first electrode and the second electrode; and a charge generation layer disposed between the first light-emitting layer and the second electrode, and the charge generation layer comprises a first connection layer, a carrier injection layer, and a second connection layer which are stacked in sequence, the first connection layer comprises an electron transport material doped with a hole blocking material, and the second connection layer comprises a hole transport material doped with an electron blocking material.

The arrangement of the charge generation layer directly affects a position of carrier transport and a position of a carrier recombination region, the carrier injection layer in the charge generation layer generates electrons and holes, the first connection layer and the second connection layer adjust the electron mobility and the hole mobility, so the number of recombination of electron and hole pairs in the light-emitting layer is increased. Therefore, the luminous efficiency of the organic light-emitting diode is improved, and hence the display effect of the display device is improved.

Figure 2:
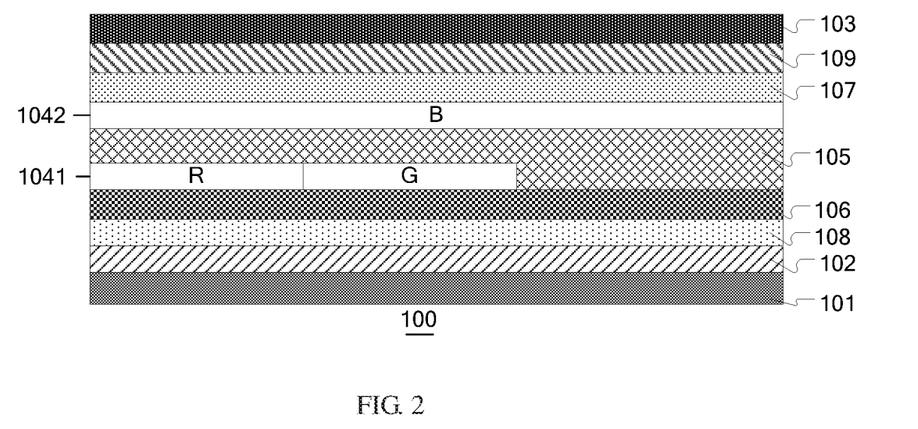
FIG. 2 is a schematic structure diagram of an organic light emitting diode provided by an embodiment of the present disclosure.

At least one embodiment of the present disclosure provides an organic light-emitting diode. For instance, FIG. 2 is a schematic structure diagram of an organic light emitting diode provided by an embodiment of the present disclosure. The organic light-emitting diode 100 comprises: a base substrate 101; a first electrode 102 and a second electrode 103 disposed on the base substrate 101; a first light-emitting layer 1041 disposed between the first electrode 102 and the second electrode 103; and a charge generation layer 105 disposed between the first light-emitting layer 1041 and the second electrode 103. The charge generation layer 105 comprises a first connection layer 1051, a carrier injection layer 1052, and a second connection layer 1053 which are stacked in sequence, the first connection layer 1051 comprises an electron transport material doped with a hole blocking material, and the second connection layer 1053 comprises a hole transport material doped with an electron blocking material.

For instance, the base substrate 101 is a transparent glass substrate or a transparent plastic substrate.

For instance, one of the first electrode 102 and the second electrode 103 is an anode and the other one is a cathode. The electrode taken as the anode comprises transparent conductive materials such as indium tin oxide (ITO) and zinc oxide (ZnO), and the electrode taken as the cathode comprises aluminum (Al), magnesium (Mg) or alloy of aluminum and magnesium. After voltage is applied to the anode and the cathode to form electrical field, the carrier injection layer 1052 may produce electrons and holes under the action of the electric field to balance the content of the electrons and the holes.

For instance, the carrier injection layer 1052 comprises metal. For instance, the carrier injection layer 1052 comprises aluminum (Al), calcium (Ca), magnesium (Mg), argentum (Ag), aurum (Au), sodium (Na), potassium (K), cesium (Cs) or lithium (Li), etc.

For instance, the carrier injection layer 1052 comprises composite material of organic material doped with metal, for instance, the composite material is anthracene derivatives, aromatic diamine compounds, triphenylamine compounds, aromatic triamine compounds or biphenyl diamine derivatives doped with Al, Ca, Mg, Ag, Au, Na, K, Cs or Li, etc.

For instance, the carrier injection layer 1052 comprises a metal compound. The metal compound is an organic metal complex or an inorganic metal compound. For instance, the organic metal complex comprises: bis(2-methyl-8-hydroxyquinoline-N1,O8)-(1,1'-biphenyl-4-hydroxy) aluminum, bis [2-(2-hydroxyphenyl-1)-pyridine] beryllium, etc.; and the inorganic metal compound comprises: $V_2O_5$, $MoO_3$, $Sb_2O_5$, PbO, etc.

For instance, thickness of the carrier injection layer is from 0.5 nm to 2 nm, for example, 0.5 nm, 1 nm or 2 nm.

For instance, the hole transport material comprises any one or any combination of aromatic diamine compounds, triphenylamine compounds, aromatic triamine compounds, biphenyl diamine derivatives, triarylamine polymers and carbazole polymers. for example, N,N'-bis-(1-naphthyl)-N, N'-diphenyl-1,1'-biphenyl-4,4'-diamine (NPB), N,N'-diphenyl-N,N'-bis(3-methyllphenyl)-(1,1'-biphenyl)-4,4'-diamine (TPD), 4,4',4"-tri(N-carbazolyl)-triphenylamine (TCTA) and polyvinyl carbazole or vinylcarbazole monomer.

For instance, the electron transport material comprises any one or any combination of 4,7-diphenyl-1,10-ophenanthroline, 2,9-bis(naphthalen-2-yl)-4,7-diphenyl-1,10-phenanthroline, 2,9-dimethyl-4,7-diphenyl-1,10-ophenanthroline and 8-hydroxyquinoline aluminum.

The electron transport material comprises 8-hydroxyquinoline lithium (Liq), 8-hydroxyquinoline gallium, bis[2-(2-hydroxyl phenyl-1)-pyridine] beryllium, 2-(4-biphenylyl)-5-(4-tert-butylphenyl)-1,3,4-oxadiazole (PBD), 1,3,5-tris (N-phenylbenzimidazol-2-yl) benzene (TPBI) or butyl carbitol piperonylate (BCP) etc.

For instance, electrical conductivity of the electron transport material is less than $10^{-6}$ S/cm, and electrical conductivity of the hole transport material is greater than $10^3$ S/cm.

For instance, the electron blocking material taken as the doping material of the hole transport material comprises any one or any combination of $MoO_3$, $Cs_2CO_3$, CsF, Al and Ir(ppz$_3$).

For instance, the hole blocking material taken as the doping material of the electron transport material comprises: 2-(4-biphenyl)-5-phenyl-1,3,4-oxadiazole, 2-(4-biphenyl)-5-(4-tert-butylphenyl)-1,3,4-oxadiazole (PBD), 3-(biphenyl-4-yl)-5-(4-tert-butylphenyl)-4-phenyl-4H-1,2,4-triazole (TAZ), 1,3,5-tris (1-phenyl-1H-benzimidazol-2-yl) benzene (TPBI), oxaline derivatives, triphenyl quinoline (TPQ), acridine derivatives, 2,6-bis(biphenyl)-4,8-diphenyl anthracene azoline, phenanthroline derivatives, etc.

For instance, as illustrated in FIG. 2, the organic light-emitting diode 100 further comprises a second light-emitting layer 1042 disposed between the second electrode 103 and the charge generation layer 105. The first light-emitting layer 1041 comprises a first light-emitting unit and a second light-emitting unit arranged in a same layer; the second light-emitting layer 1042 comprises a third light-emitting unit. For example, the first light-emitting unit comprises a red light emitting material, the second light-emitting unit comprises a green light emitting material, and the third light-emitting unit comprises a blue light emitting material.

For instance, in the embodiment of the present disclosure, the material of the first light-emitting layer 1041 and the material of the second light-emitting layer 1042 are selected according to different colors of light emitted by the first light-emitting layer and the second light-emitting layer. Besides, according to the need, organic light-emitting materials in the embodiment of the present disclosure comprise fluorescent light-emitting materials or phosphorescence light-emitting materials, and at present an adopt-mixed system is usually used, that is the usable light-emitting materials are obtained by adding the doping materials to the main light-emitting materials. For example, the metal complex materials, the derivatives of anthracene, aromatic diamine compounds, triphenylamine compounds, aromatic triamine compounds, biphenyl diamine derivatives, or triarylamines polymers, etc can be used as the main light-emitting materials. For example, double (2-methyl-8-hydroxyquinoline-N1,O8)-(1,1'-biphenyl-4-hydroxy aluminium (Balq), 9,10-di(2-naphthyl) anthracene (ADN), TAZ, 4,4'-di(9-carbazole) biphenyl (CBP), MCP, 4,4',4'-tri (9-carbazole base) triphenylamine (TCTA) or N, N-double (alpha-naphthyl-phenyl)-4, 4-biphenyl diamine (NPB), etc. The fluorescent light-emitting materials or the mixed materials, for example, comprise coumarin dyes (coumarin 6, C-545-t), quinacridone (DMQA), or 4-(dinitrile methylene)-2-methyl-6-(4-dimethylamino-styrene)-4H-pyran (DCM) series, etc. The phosphorescence light-emitting materials or the doped materials, for example, comprise the metal complex luminescence materials based on the Ir, Pt, Ru, Cu metal, etc. For example: FIrpic, Fir6, FirN4, FIrtaz, Ir(ppy)$_3$, Ir(ppy)$_2$(acac), PtOEP, (btp)$_2$Iracac, Ir(piq)$_2$(acac) or (MDQ)$_2$Iracac and so on. Besides, the light-emitting materials can also include the double main body and doping material.

For instance, the red light-emitting layer comprises 4,4'-bis (N-carbazole)-1,1'-biphenyl doped with 5,6,11,12-tetraphenylnaphthacene, according to a mass percentage, the ratio of 4,4'-bis (N-carbazole)-1,1'-biphenyl to 5,6,11,12-tetraphenylnaphthacene is 97:3. For instance, the green light-emitting layer comprises 1,3,5-tris(bromomethyl) benzene doped with N, N'-dimethylquinacridone, according to a mass percentage, the ratio of 1,3,5-tris(bromomethyl) benzene to N, N'-dimethylquinacridone is 85:15. In the embodiment of the present disclosure, the first light-emitting layer 1041 is formed by the solution process.

For instance, the blue light-emitting layer comprises 3-tert-butyl-9,10-bis(2-naphthalene)anthracene doped with 2,5,8,11-tetra-tert-butylperylene, according to a mass percentage, the ratio of 3-tert-butyl-9,10-bis(2-naphthalene)anthracene to 2,5,8,11-tetra-tert-butylperylene is 95:5. In the embodiment of the present disclosure, the second light-emitting layer 1042 is formed by the vacuum deposition process.

It should be noted that, the light-emitting unit may be made of light-emitting materials of other colors. The number of the light-emitting units of the organic light-emitting layers and the light-emitting materials of the light-emitting units may be determined according to actual conditions, which are not limited herein. As illustrated in FIG. 2, the first light-emitting unit, the second light-emitting unit and the third light-emitting unit are arranged in two layers. In actual application, the arrangement modes of the light-emitting units may be determined according to actual conditions, which is not limited herein.

Figure 3:
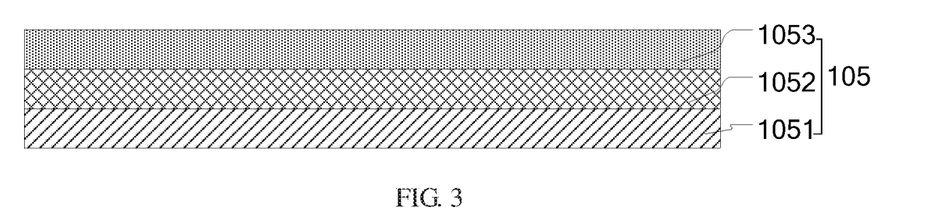
FIG. 3 is a schematic structure diagram of a charge generation layer provided by an embodiment of the present disclosure.

For instance, as illustrated in FIG. 2 and FIG. 3, the charge generation layer 105 is disposed between the first light-emitting layer 1041 and the second light-emitting layer 1042, and the charge generation layer 105 is in contact with both the first light-emitting layer 1041 and the second light-emitting layer 1042. The first connection layer 1051 and the second connection layer 1053 may adjust the electron mobility and the hole mobility, the holes and the electrons in the OLED are more balanced by the electrons and the holes generated by the carrier injection layer 1052, so the number of recombination of electron and hole pairs in the first light-emitting layer 1041 and the second light-emitting layer 1042 is increased. Therefore, the luminous efficiency of the organic light-emitting diode is improved.

For instance, the first connection layer 1051 comprises a mixture of applicable materials of the electron transport layer doped with the hole blocking materials. Thus, it is more favorable for the electrons generated by the carrier injection layer 1052 to be transmitted to the red light-emitting layer or the green light-emitting layer and hence recombined with holes injected from the anode to form excitons, so that the number of recombination of electron and hole pairs in the red light-emitting layer and the green light-emitting layer is increased. Therefore, the organic material in the red light-emitting layer is excited to emit red light, and the organic material in the green light-emitting layer is excited to emit green light, so that the luminous efficiency of the red light and the green light is improved.

For instance, the second connection layer 1053 comprises a mixture of applicable materials of the hole transport layer doped with the electron blocking materials. Thus, it is more favorable for the holes generated by the carrier injection layer 1052 to be transmitted to the blue light-emitting layer and recombined with electrons injected from the cathode to form excitons, so that the number of recombination of electron and hole pairs in the blue light-emitting layer is increased. Therefore, the organic material in the blue light-emitting layer is excited to emit blue light, so that the luminous efficiency of the blue light is improved.

For instance, the thickness of the first connection layer 1051 is from 0.5 nm to 3 nm, for example, 2 nm; the thickness of the second connection layer 1053 is from 0.5 nm to 3 nm, for example, 2 nm; and the thickness of the carrier injection layer is from 0.5 nm to 2 nm, for example, 1 nm.

For instance, as illustrated in FIG. 2, in order to improve the luminous efficiency of the organic light-emitting diode effectively, the first electrode 102 is taken as the anode; the hole transport layer 106 is disposed between the first electrode 102 and the first light-emitting layer 1041; and the hole transport layer 106 is formed by the solution process. The second electrode 103 is taken as the cathode; the electron transport layer 107 is disposed between the second electrode 103 and the second light-emitting layer 1042; and the electron transport layer 107 is formed by the vacuum deposition process.

For instance, the thickness of the hole transport layer 106 is from 10 nm to 180 nm; and the thickness of the electron transport layer 107 is from 10 nm to 35 nm.

For instance, as illustrated in FIG. 2, the organic light-emitting diode 100 further comprises an electron injection layer 109 disposed between the second electrode 103 and the electron transport layer 107, and a hole injection layer 108 disposed between the first electrode 102 and the hole transport layer 106.

For instance, the thickness of the hole injection layer is from 10 nm to 180 nm; and the thickness of the electron injection layer is from 1 nm to 5 nm.

For instance, the material of the hole injection layer comprises any one or any combination of poly(3,4-ethylenedioxythiophene)-polystyrolsulfon acid (PEDOT/PSS), polythiophene and polyaniline. The material of the hole injection layer further comprises tri[4-(5-phenyl-2-thiophene) phenyl] amine, 4,4',4"-tri[2-naphthyl (phenyl) amino] triphenylamine (2-TNATA), 4,4',4"-tri(3-methyl phenyl aniline) triphenylamine (m-MTDATA), copper phthalocyanine (CuPc), or TPD.

For instance, the material of the electron injection layer comprises any one or any combination of LiF and 8-hydroxyquinoline-lithium. The electron injection layer for example may be made of alkali metal oxides, alkali metal fluorides, etc. The alkali metal oxides include lithium oxide (Li$_2$O), lithium boron oxide (LiBO), potassium silicate (K$_2$SiO$_3$), cesium carbonate (Cs$_2$CO$_3$), etc. The alkali metal fluorides include sodium fluoride (NaF), etc.

For instance, the thickness of the hole injection layer 108 is from 10 nm to 180 nm, and the thickness of the electron injection layer 109 is from 1 nm to 5 nm.

The working principle of the organic light-emitting diode is that: in a case that voltage is applied to the first electrode 102 and the second electrode 103, and driven by the external voltage, holes injected from the first electrode 102 (anode) enter the first light-emitting layer 1041 through the hole injection layer 108 and the hole transport layer 106, and subsequently enter the first connection layer 1051; electrons injected from the second electrode 103 (cathode) enter the second light-emitting layer 1042 through the electron injection layer 109 and the electron transport layer 107, and subsequently enter the second connection layer 1053; the carrier injection layer 1052 produces electrons and holes under the action of an electric field force; the transmission rate of the electrons produced by the carrier injection layer 1052 in the first connection layer 1051 is faster than the transmission rate of the holes produced by the carrier injection layer 1052 in the first connection layer 1051; the electrons produced by the carrier injection layer 1052 are recombined with the holes injected from the anode 102; or the holes produced by the carrier injection layer 1052 cannot be transmitted in the first connection layer 1051, and only the electrons are allowed to be transmitted to the first light-emitting layer 1041 and be recombined with the holes injected from the anode 102, so the number of recombination of electron and hole pairs in the light-emitting layer is increased, and the luminous efficiency of red light and green light is improved. The transmission rate of the holes produced by the carrier injection layer 1052 in the second connection layer 1053 is faster than the transmission rate of the electrons produced by the carrier injection layer 1052 in the second connection layer 1053. The holes produced by the carrier injection layer 1052 are recombined with the electrons injected from the cathode, or the electrons produced by the carrier injection layer 1052 cannot be transmitted in the second connection layer 1053, and only the holes are allowed to be transmitted to the second light-emitting layer 1042 and be recombined with the electrons injected from the cathode 103, so that the number of recombination of electron and hole pairs in the blue light-emitting layer is increased, and hence the luminous efficiency of blue light is improved.

The effectiveness of the organic light-emitting diode provided by the embodiment of the present disclosure is proved by experiments described below. Firstly, an organic light-emitting diode not provided with a charge generation layer is taken as a contrast organic light-emitting diode. FIG. 1 is the structure of the organic light-emitting diode in the comparative example, materials and thicknesses of other functional layers of the contrast organic light-emitting diode are all the same with those of the organic light-emitting diode provided by the embodiment of the present disclosure. The experiment is conducted under the condition that the contrast organic light-emitting diode has a same brightness with the organic light-emitting diode provided by the embodiment of the present disclosure. FIG. 2 illustrates the structure of the organic light-emitting diode provided by the embodiment of the present disclosure, the brightness of the contrast organic light-emitting diode and the organic light-emitting diode provided by the embodiment of the present disclosure is set to be 1,000 nits.

TABLE 1

| Device | Voltage(V) | Efficiency (Cd/A) | EQE (%) |
| --- | --- | --- | --- |
| contrast organic light-emitting diode | 4.0 | 7.1 | 6.3 |
| organic light-emitting diode | 3.8 | 8.6 | 7.9 |

TABLE 1-continued

| Device | Voltage(V) | Efficiency (Cd/A) | EQE (%) |
| --- | --- | --- | --- |
| provided by the embodiment of the present disclosure | | | |

It can be seen from the Table 1, under the condition of the same brightness, the voltage required by the organic light-emitting diode provided by the embodiment of the present disclosure is less than that of the contrast organic light-emitting diode, but the luminous efficiency of the organic light-emitting diode provided by the embodiment of the present disclosure is higher than that of the contrast organic light-emitting diode. The external quantum efficiency (EQE) of the organic light-emitting diode provided by the embodiment of the present disclosure is also higher than that of the contrast organic light-emitting diode. In the study of the organic light-emitting diode, the external quantum efficiency is often used to characterize the luminous efficiency. EQE refers to a ratio of the number of photons emitted by the organic light-emitting diode to the number of injected electrons (holes) excited by luminescence.

At least one embodiment of the present disclosure further provides a display device, and the display device comprises any one of the organic light-emitting diode provided by the embodiment of the present disclosure.

For instance, the display device is a mobile phone, a notebook computer, a television, a display screen, a notebook computer, a digital camera, a navigation system and any other product or component having a display function. Other necessary components of the display device shall all be understood by those skilled in the art to be comprised, and detailed descriptions will be omitted here, and shall not be construed as the limitation of the present disclosure. The embodiments of the display device may refer to the embodiments of the organic light-emitting diode, and detailed descriptions will be omitted here.

Figure 4:
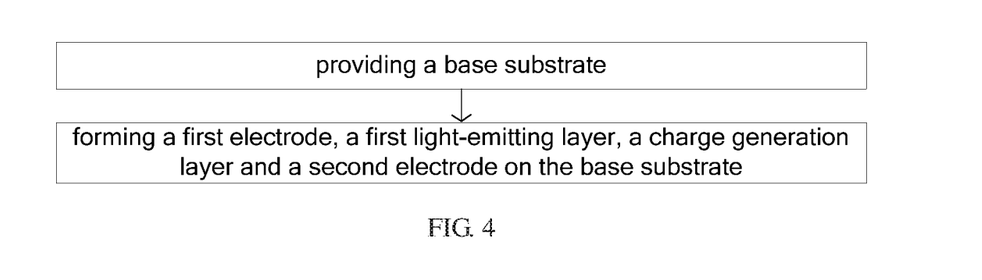
FIG. 4 is a flow diagram of a method for manufacturing an organic light emitting diode provided by an embodiment of the present disclosure.

The embodiment of the present disclosure further provides a method for manufacturing an organic light-emitting diode. FIG. 4 is a flow diagram of a method for manufacturing an organic light emitting diode provided by an embodiment of the present disclosure. The manufacturing method comprises the following operations:

providing a base substrate, in which the base substrate is a transparent glass substrate or a transparent plastic substrate; and forming a first electrode, a first light-emitting layer, a charge generation layer and a second electrode on the base substrate in sequence.

For instance, the charge generation layer comprises a first connection layer, a carrier injection layer, and a second connection layer which are stacked in sequence, the first connection layer comprises an electron transport material doped with a hole blocking material, and the second connection layer comprises a hole transport material doped with an electron blocking material.

For instance, the forming process of the charge generation layer comprises the operations of forming the first connection layer, the carrier injection layer and the second connection layer in sequence by a vapor deposition process. The first connection layer comprises a mixture of applicable materials of the electron transport layer doped with the hole blocking materials. Thus, it is more favorable for the electrons generated by the carrier injection layer to be transmitted to the red light-emitting layer or the green light-emitting layer and hence recombined with holes injected from the anode to form excitons. The organic material in the red light-emitting layer is excited to emit red light, and the organic material in the green light-emitting layer is excited to emit green light, so that the luminous efficiency of the red light and the green light is improved. For instance, the second connection layer comprises a mixture of applicable materials of the hole transport layer doped with the electron blocking materials. Thus, it is more favorable for the holes generated by the carrier injection layer to be transmitted to the blue light-emitting layer and recombined with electrons injected from the cathode to form excitons. Therefore, the organic material in the blue light-emitting layer is excited to emit blue light, so that the luminous efficiency of the blue light is improved.

For instance, the carrier injection layer comprises a metal, a composite material of an organic material and a metal, or a metal compound.

For instance, the carrier injection layer comprises a composite material of an organic material doped with a metal, for instance, the composite material is anthracene derivatives, aromatic diamine compounds, triphenylamine compounds, aromatic triamine compounds or biphenyl diamine derivatives doped with Al, Ca, Mg, Ag, Au, Na, K, Cs or Li, etc.

For instance, the carrier injection layer comprises an organic metal complex. For instance, the organic metal complex comprises: bis(2-methyl-8-hydroxyquinoline-N1, O8)-(1,1'-biphenyl-4-hydroxy) aluminum and bis[2-(2-hydroxyphenyl-1)-pyridine] beryllium, etc.

For instance, the thickness of the first connection layer 1051 is from 0.5 nm to 3 nm, the thickness of the second connection layer 1053 is from 0.5 nm to 3 nm, and the thickness of the carrier injection layer is from 0.5 nm to 2 nm.

The carrier injection layer in the charge generation layer can produce electrons and holes, the first connection layer and the second connection layer can adjust the transmission of electrons and holes, so the number of recombination of electron and hole pairs in the light-emitting layer is increased. Therefore, the luminous efficiency of the organic light-emitting diode is improved, and hence the display effect of the display device is improved.

For instance, one of the first electrode and the second electrode is an anode and the other one is a cathode. The second electrode (cathode) is formed by the vacuum deposition method through a metal cathode mask, and the evaporation rate is from 0.1 nm/s to 1 nm/s, for example, the evaporation rate is 0.5 nm/s. For instance, the cathode comprises Al, or an alloy of Al and Mg, etc., and the thickness of the cathode is from 80 nm to 120 nm. For instance, the anode comprises transparent conductive materials such as ITO and ZnO.

For instance, the first light-emitting layer is formed on the first electrodes by solution process.

For instance, the manufacturing method further comprises: forming a charge generation layer between the first light-emitting layer and the second electrode by vapor deposition process, and forming a second light-emitting layer between the second electrode and the charge generation layer by vapor deposition process.

For instance, the manufacturing method further comprises: forming a hole transport layer between the first electrode and the first light-emitting layer by the solution process, and forming an electron transport layer between the second electrode and the second light-emitting layer by the vapor deposition process.

For instance, the manufacturing method further comprises: forming a hole injection layer between the first electrode and the hole transport layer by solution process, and forming an electron injection layer between the second electrode and the electron transport layer by the vapor deposition process.

For instance, the manufacturing process of the organic light-emitting diode comprises: cleaning the base substrate provided with the first electrode in an ultrasonic environment by deionized water, acetone and anhydrous alcohol; after the cleaning process, drying the base substrate by nitrogen, and removing residual impurities by performing UV irradiation, or oxygen plasma treatment or nitrogen plasma treatment on the base substrate. After the treatment, a hole injection layer, a hole transport layer and a first light-emitting layer are formed on the anode in sequence by solution process, and the first light-emitting layer comprises a red light-emitting layer and a green light-emitting layer. Subsequently, a charge generation layer, a second light-emitting layer, an electron transport layer and an electron injection layer are formed on the first light-emitting layer in sequence by the vapor deposition process, and the second light-emitting layer comprises a blue light-emitting layer. As both the charge generation layer and the second light-emitting layer are formed by the vacuum deposition process, the manufacturing process is simplified and the production cost is reduced.

For instance, the charge generation layer, the blue light-emitting layer, the electron transport layer and the electron injection layer are formed by the vacuum deposition process via an open mask. The vapor deposition conditions are that: the vacuum degree is lower than $5 \times 10^{-4}$ Pa, and the vapor deposition rate is 0.01 nm/s to 0.5 nm/s, for example, 0.1 nm/s.

The materials of the hole transport layer, the hole injection layer, the electron transport layer, the electron injection layer, the red light-emitting layer, the green light-emitting layer and the blue light-emitting layer may refer to relevant descriptions in the above embodiments, and detailed descriptions will be omitted here.

It should be noted that, in the manufacturing method of the organic light-emitting diode provided by the embodiment of the present disclosure, besides the solution process and the vacuum deposition process, other manufacturing processes capable of patterning substrates are included, and detailed descriptions will be omitted here.

The organic light-emitting diode and the display device comprising the organic light-emitting diode provided by at least one embodiment of the present disclosure at least have the following advantages: the carrier injection layer produces electrons and holes under the action of the electric field force, the electron mobility and the hole mobility are adjusted by the first connection layer and the second connection layer. The newly produced electrons are recombined with the holes injected from the anode, so that the number of recombination of electron and hole pairs in the red light-emitting layer and the green light-emitting layer is increased, so that the luminous efficiency of the red light and the green light is improved. The newly produced holes are recombined with the electrons injected from the cathode, so that the number of recombination of electron and hole pairs in the blue light-emitting layer is increased, and hence the luminous efficiency of blue light is improved.

There are also some points to be illustrated in the present disclosure:

(1) Drawings of the embodiments of the present disclosure only refer to structures related with the embodiments of the present disclosure, and other structures may refer to general design.

(2) In order to make it clear, in the drawings for illustrating the embodiment of the present disclosure, thicknesses of a layer or a region are magnified or reduced, that is, those drawings are not drawn according to actual proportion. It can be understood that, in a case that a layer, a film, a region or a substrate and so on is disposed on or under another element, the elements to be "direct" disposed on or under another element, or there may be an intermediate element.

(3) In case of no conflict, the embodiments of the present disclosure and the features of the embodiments may be combined with each other to form new embodiments.

What are described above is related to the illustrative embodiments of the disclosure only and not limitative to the scope of the disclosure; the scopes of the disclosure are defined by the accompanying claims.

The present application claims priority of the Chinese Patent Application No. 201610665931.2, filed on Aug. 12, 2016, the entire disclosure of which is incorporated herein by reference as part of the present application.

What is claimed is:

1. An organic light-emitting diode, comprising:
a base substrate;
a first electrode and a second electrode disposed on the base substrate;
a first light-emitting layer disposed between the first electrode and the second electrode;
a hole transport layer disposed between the first electrode and the first light-emitting layer; and
a charge generation layer disposed between the first light-emitting layer and the second electrode,
wherein the charge generation layer comprises a first connection layer, a carrier injection layer, and a second connection layer which are stacked in sequence,
the first connection layer comprises an electron transport material doped with a hole blocking material, and the second connection layer comprises a hole transport material doped with an electron blocking material,
a surface of the first light-emitting layer closer to the base substrate and a surface of the charge generation layer closer to the base substrate are in a same plane, and the surface of the charge generation layer closer to the base substrate is in direct contact with the hole transport layer; and
the carrier injection layer consists of anthracene derivatives, aromatic diamine compounds, triphenylamine compounds, aromatic triamine compounds, or biphenyl diamine derivatives,
wherein the anthracene derivatives, the aromatic diamine compounds, the triphenylamine compounds, the aromatic triamine compounds, and the biphenyl diamine derivatives are doped with Al, Ca, M, Ag, Au, Na, K, Cs, or Li.

2. The organic light-emitting diode according to claim 1, wherein the hole transport material comprises any one or any combination of aromatic diamine compounds, triphenylamine compounds, aromatic triamine compounds, biphenyl diamine derivatives, triarylamine polymers, and carbazole polymers.

3. The organic light-emitting diode according to claim 1, wherein the electron transport material comprises any one or any combination of 4,7-diphenyl-1,10-ophenanthroline, 2,9-bis(naphthalen-2-yl)-4,7-diphenyl-1,10-phenanthroline, 2,9-dimethyl-4,7-biphenyl-1,10-ophenanthroline, and 8-hydroxyquinoline aluminum.

4. The organic light-emitting diode according to claim 1, wherein an electrical conductivity of the electron transport material is less than $10^{-6}$ S/cm, and an electrical conductivity of the hole transport material is greater than $10^3$ S/cm.

5. The organic light-emitting diode according to claim 1, wherein the electron blocking material comprises any one or any combination of $MoO_3$, $Cs_2CO_3$, CsF, Al, and $Ir(ppz_3)$.

6. The organic light-emitting diode according to claim 1, wherein the hole blocking material comprises any one or any combination of 2-(4-biphenyl)-5-phenyl-1,3,4-oxadiazole, 3-(biphenyl-4-yl)-5-(4-tert-butylphenyl)-4-phenyl-4H-1,2,4-triazole, 1,3,5-tris(1-phenyl-1H-benzimidazol-2-yl) benzene, triphenyl quinoline, and 2,6-bis (biphenyl)-4,8-diphenyl anthracene azoline.

7. The organic light-emitting diode according to claim 1, wherein a thickness of the carrier injection layer is from 0.5 nm to 2 nm.

8. The organic light-emitting diode according to claim 1, further comprising a second light-emitting layer disposed between the second electrode and the charge generation layer.

9. The organic light-emitting diode according to claim 8, wherein the first light-emitting layer comprises a first light-emitting unit and a second light-emitting unit;
the second light-emitting layer comprises a third light-emitting unit;
the first light-emitting unit comprises a red light emitting material; the second light-emitting unit comprises a green light emitting material; and the third light-emitting unit comprises a blue light emitting material.

10. The organic light-emitting diode according to claim 8, further comprising:
an electron transport layer disposed between the second electrode and the second light-emitting layer.

11. The organic light-emitting diode according to claim 10, wherein a thickness of the hole transport layer is from 10 nm to 180 nm; and a thickness of the electron transport layer is from 10 nm to 35 nm.

12. The organic light-emitting diode according to claim 10, further comprising:
a hole injection layer disposed between the first electrode and the hole transport layer; and
an electron injection layer disposed between the second electrode and the electron transport layer.

13. The organic light-emitting diode according to claim 12, wherein a thickness of the hole injection layer is from 10 nm to 180 nm; and a thickness of the electron injection layer is from 1 nm to 5 nm.

14. The organic light-emitting diode according to claim 12, wherein a material of the hole injection layer comprises any one or any combination of poly(3,4-ethylenedioxythiophene)-polystyrolsulfon acid (PEDOT/PSS), polythiophene, and polyaniline.

15. The organic light-emitting diode according to claim 12, wherein a material of the electron injection layer comprises any one or any combination of LiF and 8-hydroxyquinoline-lithium.

16. A display device, comprising the organic light-emitting diode according to claim 1.

17. A method for manufacturing an organic light-emitting diode, comprising:
providing a base substrate; and forming a first electrode, a hole transport layer, a first light-emitting layer, a charge generation layer, and a second electrode on the base substrate, wherein the charge generation layer comprises a first connection layer, a carrier injection layer, and a second connection layer which are stacked in sequence, the first connection layer comprises an electron transport material doped with a hole blocking material, and the second connection layer comprises a hole transport material doped with an electron blocking material, a surface of the first light-emitting layer closer to the base substrate and a surface of the charge generation layer closer to the base substrate are in a same plane, and the surface of the charge generation layer closer to the base substrate is in direct contact with the hole transport layer, and the carrier injection layer consists of anthracene derivatives, aromatic diamine compounds, triphenylamine compounds, aromatic triamine compounds, or biphenyl diamine derivatives, wherein the anthracene derivatives, the aromatic diamine compounds, the triphenylamine compounds, the aromatic triamine compounds, and the biphenyl diamine derivatives are doped with Al, Ca, Mg, Ag, Au, Na, K, Cs, or Li.

18. The method according to claim 17, comprising: forming the first light-emitting layer on the first electrode by a solution process.

\* \* \* \* \*